Dec. 17, 1957 J. C. STEWART ET AL 2,817,018

OSCILLATORS

Filed Aug. 18, 1955

Inventors
James C. Stewart
Thomas H. Stanley
John N. Almgren
by Ward, Neal, Haselton, Orme & McElhannon
Attorneys United States Patent Office 2,817,018
Patented Dec. 17, 1957

2,817,018

OSCILLATORS

James Charles Stewart, Lane Cove, near Sydney, New South Wales, Thomas Henry Stanley, Ryde, near Sydney, New South Wales, and John Nils Almgren, North Sydney, New South Wales, Australia, assignors to T. S. Skillman and Company Pty. Limited, Cammeray, New South Wales, Australia, a company of New South Wales, Australia Application August 18, 1955, Serial No. 529,254

7 Claims. (Cl. 250—36)

Figures 1, 2:
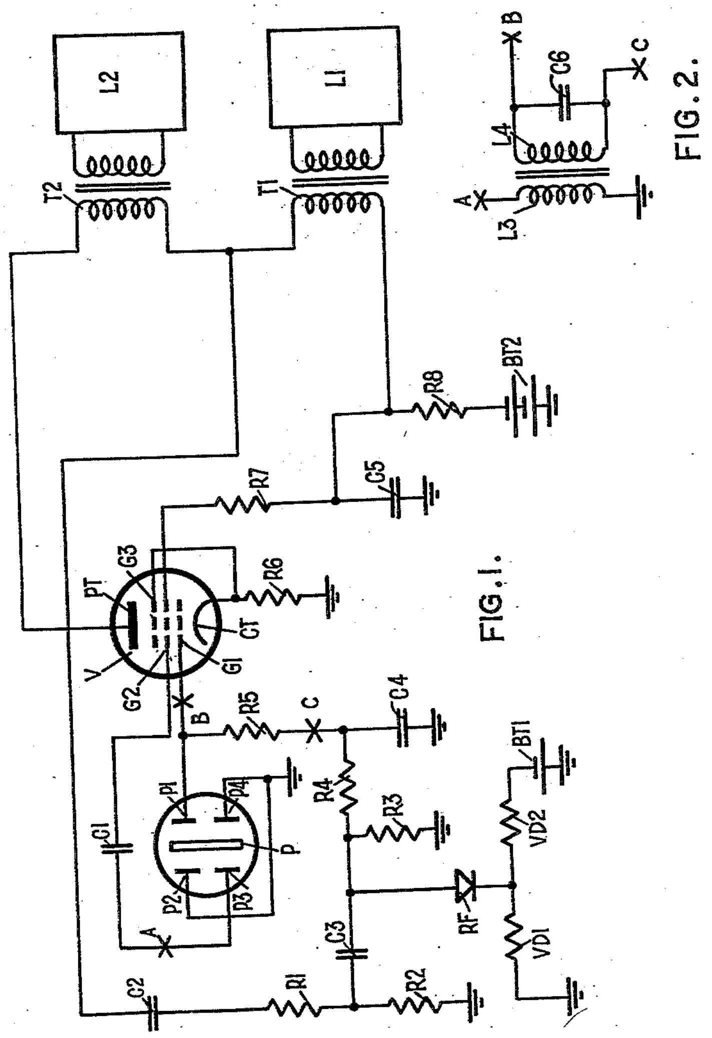

The invention relates to improvements in oscillators of the type which employ a single screen-grid valve, and is especially advantageous in crystal oscillators in which the oscillating frequency is determined by a piezo-electric device.

In oscillators of the type to which the invention relates oscillation is produced by positive feedback (over a circuit tuned in some manner to the desired frequency of oscillation) from screen grid to control grid, and the output of the oscillator is stabilized by negative envelope feedback from the output circuit.

An object of the invention is to provide an oscillator of this type in which the output is closely stabilized for wide variations of power supply voltages and (when the tuned circuit comprises a piezoelectric crystal) for crystals of widely varying characteristics.

Other objects of the invention, when the tuned circuit comprises a piezoelectric crystal, are to achieve a maximum power output from the oscillator without overloading the crystal, and to avoid spurious-mode oscillation of the crystal.

A further object of the invention is to devise an oscillator useful as a source of carrier supply for a plurality of carrier telephone channels or the like by providing a low loss distribution network arrangement with high loss channel to channel decoupling, enabling, for example, a carrier frequency to be supplied to a plurality of modulators or demodulators without interference between them.

According to the invention the various objects are achieved in oscillators of the kinds referred to above by making the alternating voltage fed back in negative sense into the grid circuit greater than a threshold value predetermined by a positive potential applied to the feedback circuit. As feedback in this case takes the form of an alternating voltage which is derived from the output of the oscillator and is rectified in the feedback circuit before being applied to the grid circuit, this kind of feedback is hereinafter referred to as envelope feedback. When the oscillator is used to feed a plurality of load circuits a valve is used which has an output impedance many times higher than the impedance of the load circuits. The load circuits are coupled to the valve by individual transformers having their primary windings connected in series in the plate circuit of the valve while the secondary windings are connected to the respective load circuits. The negative envelope feedback is derived in this case from the voltage generated across the primary winding of the transformer connected farthest away electrically from the plate of the oscillator valve.

The invention will be more clearly understood from the following description in connection with the drawings, in which Fig. 1 shows schematically the circuit of a crystal oscillator incorporating the invention, Fig. 2 shows a modification for the circuit of Fig. 1 in replacing the piezoelectric crystal by a coil-condenser circuit.

The oscillator shown in Fig. 1 has a valve V with the cathode electrode CT, the anode or plate electrode PT and the three grid electrodes G1, G2 and G3. The valve V is driven by a piezoelectric crystal P with the electrodes P1, P2, P3 and P4, while the plate potential is taken from battery BT2 over resistor R8. The plate PT of valve V is connected to the series-connected primary windings of transformers T1 and T2, the secondary windings of which are connected with appropriate load circuits indicated by the squares L1 and L2. Battery BT2 and resistor R8 are by-passed for alternating current by condenser C5. The automatic volume control or envelope feedback operates over a rectifier RF. The functions of the various resistors and condensers in the circuit will appear hereinafter.

The oscillator is made to oscillate by the positive feedback path from the screen grid G2 of valve V over condenser C1 to electrode P3 of the piezoelectric crystal P, while the output of the oscillator is stabilized by negative envelope feedback as shown by the feedback path over condenser C2, resistors R1 and R2 and condenser C3, the rectifier RF, resistors R3, R4 and R5. This envelope feedback not only stabilizes, but also helps to reduce noise and other disturbances.

It is desired to have the envelope feedback stabilize the output for wide variations of power supply voltage, and when crystals of widely varying characteristics are used. To achieve this according to the invention the A. C. voltage fed back in negative sense in the envelope loop is made rather large, and to avoid this resulting in the plate current being very much depressed at full output voltage, the voltage fed back is required to overcome a large bias before it becomes effective.

The envelope feedback takes place over condenser C2 and resistors R1 and R2 to earth. The resistors R1 and R2 act as a potential divider and part of the fed-back voltage is taken off and supplied over condenser C3 to the rectifier RF. There is a positive potential on the other side of rectifier RF supplied from battery BT1 over a voltage divider consisting of the resistors VD1 and VD2, and the envelope feedback voltage has to reach a certain threshold value before it will overcome this positive voltage. When this stage is reached the voltage fed back is rectified by rectifier RF and after suitable smoothing by resistor R4 and condenser C4 is applied as negative bias to the grid G1 of valve V thus stabilizing the output of the oscillator. As the A. C. feedback voltage via C3 has to overcome the positive bias supplied to rectifier RF from voltage divider VD1, VD2 before it can begin to act on the grid bias of the valve V, a certain delay occurs in the function of this automatic volume control thus keeping the grid bias (and so the plate current) constant despite variations in output voltage within certain limits. Thereafter the delayed automatic volume control type of feedback provides a rather marked response to further changes in output and thus feedback voltage.

A further advantage of the arrangement is that the time normally required for an oscillator to build up to the operating level of power output is very considerably reduced.

Still another advantage is that the plate current is kept at a point where it remains more undistorted then when no delay is used. This confers added stability on the oscillator by avoiding reaction of supply voltage on frequency.

The circuit shown in the drawing incorporates in addition the very desirable feature of preventing spurious-mode oscillations. This is achieved by making the bias on the control grid G1 slightly positive for all conditions until the envelope feedback operates, by which time the correct mode of crystal vibration is established and will be maintained. This positive grid bias is derived from a voltage divider formed by the rectifier RF (in the backward direction) and the resistor R3; and is transferred via the resistors R4 and R5 to the grid of valve V. This bias makes the grid conducting, and reduces the impedance terminating the crystal which enables it to start to oscillate in the correct mode. The rectifier RF is of a type in which the backward resistance is several times R3, but is not so large as to be completely short-circuited to earth by R3.

As it is desired to get substantial power output from the crystal circuit without overloading the crystal itself the screen resistor (R7 in the drawing) is kept at as low a value as possible, but high enough to permit all crystals—good or poor—to oscillate. At the same time the plate current in the oscillating state is kept at a high value by keeping the bias of the feedback circuit high enough so that the envelope feedback is blocked if the output voltage per load falls below a threshold just a little lower than the required value. Although a delayed automatic volume control for oscillators had been proposed earlier, this proposed arrangement operated with a very high screen resistance and required a very low value of bias to avoid any strain on the crystal. A high screen resistor is accompanied by a high A. C. screen voltage and so a reduced grid-plate conductance. This necessitates higher grid voltage for the same output and so more drive on the crystal. The new arrangement allows a higher output power without undue overloading of the crystal itself.

The invention is especially applicable where a plurality of loads is to be connected to the oscillator. It is known to use a common oscillator for a plurality of carrier channels connected in parallel and to avoid interference between the channels by making the impedance of the oscillator output very low compared with the impedance of each connected load. Although satisfactory freedom from voice interference can be achieved the required power output is very high even when only a small number of channels are connected to the oscillator.

The oscillator according to the invention overcomes this disadvantage by feeding each load, for example a modulator or demodulator of a carrier telephone channel, from a separate transformer and by connecting the primary windings of these transformers in series as shown for the transformers T1 and T2. At the same time the plate impedance is kept at a high value many times the value of the load impedance, for example by using a pentode valve V, and can to advantage be made even higher by using negative current feedback for the carrier frequency rather than voltage feedback, as shown by resistor R6 which is kept unbypassed in the lead of cathode CT of valve V. The output impedance of the oscillator is also kept high by the envelope feedback circuit, thus preventing coupling between one output transformer and the others. In this way the required power output compared with the abovementioned known arrangements is considerably reduced with the same amount of decoupling between the various loads.

As mentioned above envelope feedback is used for stabilizing the oscillator and this feedback is derived from the voltage generated across the output transformer T1 which is connected farthest away electrically from the plate of the valve. This confers the advantage that further transformers can be added, as the need arises, without changing appreciably the output from the first transformer T1, as long as the total output energy to be taken from the oscillator is kept within the limits of power output capacity for which the oscillator was designed originally.

The invention has been described above in connection with one embodiment thereof, but it must be understood that modifications are possible without departing from the scope of the invention. In particular the invention can also be applied to a screen grid type of oscillator controlled by a coil-condenser arrangement. The modifications which have to be made to the circuit of Fig. 1 are shown in Fig. 2. The piezoelectric crystal P in Fig. 1 is disconnected at the points A, B and C and the coil-condenser arrangement L3, L4, C6 of Fig. 2 is inserted instead as indicated by the corresponding terminals A, B and C. In this case the coil L4 forms together with the condenser C6 a frequency determining circuit. The procedures outlined above for proportioning the circuit elements, and for choosing the operating points, still apply and all confer marked advantages.

We claim:

1. A thermionic oscillator employing an electronic valve having a cathode, a control grid, a screen grid and an anode, an output circuit extending between said anode and said cathode and including a source of potential, an oscillation unit having a screen grid circuit extending between said screen grid and said cathode, and a control grid circuit extending between said control grid and said cathode, said screen grid circuit and said control grid circuit being coupled to provide positive feedback between said screen grid and said control grid and to determine the frequency of oscillation, a feedback circuit connected with said output circuit and said control grid circuit to feed negative envelope feedback to said control grid circuit to stabilize the output energy of said oscillator, said negative feedback circuit including rectifying means to rectify the alternating voltage derived from said output circuit, and a source of positive potential and a resistor connected to said rectifying means to form a voltage divider for applying a predetermined positive potential to said negative feedback circuit, said alternating voltage being greater than said predetermined positive potential, and the resultant rectified voltage being applied as negative potential to said control grid circuit.

2. A thermionic oscillator employing an electronic valve having a cathode, a control grid, a screen grid and an anode, an output circuit extending between said anode and said cathode and including a source of potential, an oscillation unit including a screen grid circuit and a control grid circuit connected with said screen grid and said control grid respectively and coupled to provide positive feedback between said screen grid and said control grid and to determine the frequency of oscillation, a feedback circuit connected with said output circuit and said control grid circuit to feed negative envelope feedback to said control grid circuit to stabilize the output energy of said oscillator, said negative feedback circuit including rectifying means to rectify the alternating voltage derived from said output circuit and filtering means consisting of a resistor-condenser combination; interposed between said rectifying means and said control grid circuit, and a source of positive potential and a resistor connected to said rectifying means to form a voltage divider for applying a predetermined positive potential to said negative feedback circuit, said alternating voltage being greater than said predetermined positive potential and the resultant rectified voltage being applied as negative potential to said control grid circuit.

3. A thermionic oscillator employing an electronic valve having a cathode, a control grid, a screen grid and an anode, an output circuit extending between said anode and said cathode and including a source of potential, a plurality of load circuits coupled to said output circuit, said valve having an output impedance many times higher than the impedance of said load circuits, for each of said load circuits a transformer having a primary and a secondary winding, said primary windings being connected in series in said output circuit of said valve and each of said secondary windings being connected with a corresponding load circuit, an oscillation unit including a screen grid circuit and a control grid circuit connected with said screen grid and said control grid respectively and coupled to provide positive feedback between said screen grid and said control grid and to determine the frequency of oscillation, a feedback circuit connected with said output circuit and said control grid circuit to feed negative envelope feedback to said control grid circuit, a source of positive potential connected with said feedback circuit to apply a predetermined positive potential thereto, and means to derive from said negative feedback circuit a voltage greater than said positive potential.

4. A thermionic oscillator employing an electronic valve having a cathode, a control grid, a screen grid and an anode, an output circuit extending between said anode and said cathode and including a source of potential, a plurality of load circuits coupled to said output circuit, said valve having an output impedance many times higher than the impedance of said load circuits, for each of said load circuits a transformer having a primary and a secondary winding, said primary windings being connected in series in said output circuit of said valve and each of said secondary windings being connected with a corresponding load circuit, an oscillation unit including a screen grid circuit and a control grid circuit connected with said screen grid and said control grid respectively and coupled to provide positive feedback between said screen grid and said control grid and to determine the frequency of oscillation, a feedback circuit connected to the primary winding of the transformer farthest away electrically from the anode of said valve to derive negative envelope feedback from the alternating voltage generated across said primary winding and to apply said negative feedback to said control grid circuit, a source of positive potential connected with said negative feedback circuit to apply a predetermined positive potential thereto, and means to derive from said negative feedback circuit a voltage greater than said positive potential.

5. A thermionic oscillator as claimed in claim 4 and including means for generating negative current feedback for the oscillation frequency to increase the output impedance.

6. A thermionic oscillator employing an electronic valve having a cathode, a control grid, a screen grid and an anode, an output circuit extending between said anode and said cathode and including a source of potential, a piezo-electric crystal having a plurality of electrodes, one of said electrodes being connected with said screen grid to form a screen grid circuit and another of said electrodes being connected with said control grid to form a control grid circuit, a feedback circuit connected with said output circuit and said control grid circuit to feed negative envelope feedback to said control grid circuit to stabilize the output energy of said oscillator, said negative feedback circuit including rectifying means to rectify the alternating voltage derived from said output circuit, and a source of positive potential connected to said rectifying means to apply a predetermined positive potential to said negative feedback circuit, said alternating voltage being greater than said predetermined positive potential, and the resultant rectified voltage being applied as negative potential to said control grid circuit.

7. A thermionic oscillator employing an electronic valve having a cathode, a control grid, a screen grid and an anode, an output circuit extending between said anode and said cathode and including a source of potential, a plurality of load circuits coupled to said output circuit, said valve having an output impedance many times higher than the impedance of said load circuits, for each of said load circuits a transformer having a primary and a secondary winding, said primary windings being connected in series in said output circuit of said valve and each of said secondary windings being connected with a corresponding load circuit, a piezoelectric crystal having a plurality of electrodes, one of said electrodes being connected with said screen grid to form a screen grid circuit and another of said electrodes being connected with said control grid to form a control grid circuit, a feedback circuit connected to the primary winding of the transformer farthest away electrically from the anode of said valve to derive negative envelope feedback from the alternating voltage generated across said primary winding and to apply said negative feedback to said control grid circuit, a source of positive potential connected with said negative feedback circuit to apply a predetermined positive potential thereto, and means to derive from said negative feedback circuit a voltage greater than said positive potential.

References Cited in the file of this patent

UNITED STATES PATENTS 2,124,189 Dow ---------------- July 19, 1938

OTHER REFERENCES

Article: "Pseudosynchronization in Amplitude Stabilized Oscillators," from vol. 36, No. 6 of P. I. R. E. for June 1948.

Article: Par. 7.16, "An Automatic Output Control Oscillator," pages 153–54 of "Vacuum Tube Oscillators" by Edson John Wiley and Sons Inc., New York, N. Y., 1953.